United States Patent
Ruta et al.

(10) Patent No.: US 11,803,202 B2
(45) Date of Patent: Oct. 31, 2023

(54) VOLTAGE REGULATOR CIRCUIT AND CORRESPONDING MEMORY DEVICE

(71) Applicant: STMicroelectronics S.r.l., Agrate Brianza (IT)

(72) Inventors: Marco Ruta, San Gregorio di Catania (IT); Antonio Conte, Tremestieri Etneo (IT); Michelangelo Pisasale, Catania (IT); Agatino Massimo Maccarrone, Regalbuto (IT); Francesco Tomaiuolo, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 29 days.

(21) Appl. No.: 17/933,972

(22) Filed: Sep. 21, 2022

(65) Prior Publication Data

US 2023/0130268 A1    Apr. 27, 2023

(30) Foreign Application Priority Data

Oct. 26, 2021 (IT) .......................... 102021000027458

(51) Int. Cl.
| | |
|---|---|
| *G05F 1/575* | (2006.01) |
| *H03K 5/05* | (2006.01) |
| *H03K 5/24* | (2006.01) |
| *H02M 3/07* | (2006.01) |

(52) U.S. Cl.
CPC ............... *G05F 1/575* (2013.01); *H02M 3/073* (2013.01); *H03K 5/05* (2013.01); *H03K 5/249* (2013.01)

(58) Field of Classification Search
None
See application file for complete search history.

(56) References Cited

U.S. PATENT DOCUMENTS

| | | | | |
|---|---|---|---|---|
| 6,262,567 | B1* | 7/2001 | Bartlett | G05F 1/465 323/283 |
| 6,597,158 | B2* | 7/2003 | Umeda | H02M 3/07 323/272 |
| 6,812,747 | B2* | 11/2004 | Ganivet et al. | H03K 17/302 327/66 |
| 7,550,954 | B2* | 6/2009 | De Nisi et al. | H02M 1/10 307/45 |
| 9,703,303 | B2* | 7/2017 | Nagda et al. | G05F 1/462 |
| 9,923,457 | B2* | 3/2018 | Yang | G11C 5/145 |
| 10,177,746 | B1* | 1/2019 | Lin | H03K 19/20 |
| 10,303,193 | B2* | 5/2019 | Sautto et al. | H03F 3/45273 |
| 2002/0118568 | A1 | 8/2002 | Tanzawa | |
| 2005/0189983 | A1* | 9/2005 | Sivero et al. | H02M 3/07 327/536 |
| 2006/0082351 | A1* | 4/2006 | Martins et al. | H02J 9/005 323/268 |
| 2022/0302817 | A1* | 9/2022 | Morimoto et al. | H02M 3/07 |

\* cited by examiner

*Primary Examiner* — Thomas J. Hiltunen
(74) *Attorney, Agent, or Firm* — Slater Matsil, LLP (57) ABSTRACT

A voltage regulator receives an input voltage and produces a regulated output voltage. A first feedback network compares a feedback signal to a reference signal to assert/de-assert a first pulsed control signal when the reference signal is higher/lower than the feedback signal. A second feedback network compares the output voltage to a threshold signal to assert/de-assert a second control signal when the threshold signal is higher/lower than the output voltage. A charge pump is enabled if the second control signal is de-asserted and is clocked by the first pulsed control signal to produce a supply voltage higher than the input voltage. A first pass element is enabled when the second control signal is asserted and is selectively activated when the first pulsed control signal is asserted. A second pass element is selectively activated when the second control signal is de-asserted.

20 Claims, 6 Drawing Sheets

VOLTAGE REGULATOR CIRCUIT AND CORRESPONDING MEMORY DEVICE

CROSS-REFERENCE TO RELATED APPLICATIONS

This application claims the benefit of Italian Patent Application No. 102021000027458, filed on Oct. 26, 2021, which application is hereby incorporated herein by reference.

TECHNICAL FIELD

The description relates to voltage regulator circuits that may be applied, for instance, to memory devices such as phase-change memory (PCM) devices, and/or general purpose microcontrollers (GP MCUs).

BACKGROUND

Low-dropout (LDO) voltage regulator circuits are widely used for industrial and automotive applications, e.g., in general purpose microcontrollers. An LDO regulator is typically an integrated circuit designed to provide a constant (e.g., fixed) output voltage over varying load conditions, with minimal voltage dropout and fast response time.

The increasing demand for portable and battery-operated electronic devices requires LDO regulators able to operate in a wide range of supply voltage and/or in multi-voltage platforms. For instance, the power supply voltage Vcc of the circuit may be in the range of 1.6 V to 3.6 V, and the operating voltage $V_{DD}$ of the chip may be in the range of 0.8 V to 1.15 V. As a consequence, standby current flow and quiescent current flow are relevant parameters in the design of LDO regulators, also considering that the LDO regulators may be expected to operate in a wide temperature range (e.g., from -40° C. to 125° C.).

Therefore, there is a need in the art to provide improved voltage regulator circuits (e.g., LDO regulators) having fast response time, small silicon area, low standby current and quiescent current consumption, and/or high current efficiency.

SUMMARY

An object of one or more embodiments is to contribute in providing such improved voltage regulator circuits.

According to one or more embodiments, such an object can be achieved by a circuit having the features set forth in the claims that follow.

One or more embodiments may relate to a corresponding memory device.

The claims are an integral part of the technical teaching provided herein in respect of the embodiments.

In one or more embodiments, a circuit comprises an input node configured to receive an input voltage, and an output node configured to produce a regulated output voltage. The circuit comprises a first feedback network configured to produce a feedback signal indicative of the regulated output voltage, and compare the feedback signal to a reference signal to produce a first pulsed control signal. The first pulsed control signal is asserted in response to the reference signal being higher than the feedback signal and de-asserted in response to the reference signal being lower than the feedback signal. A time-averaged value of the first pulsed control signal is thus a function of (e.g., it is linearly dependent on, or proportional to) the difference between the reference signal and the feedback signal. The circuit comprises a second feedback network configured to produce a threshold signal indicative of the input voltage, and compare the regulated output voltage to the threshold signal to produce a second control signal. The second control signal is asserted in response to the threshold signal being higher than the regulated output voltage and de-asserted in response to the threshold signal being lower than the regulated output voltage. The circuit comprises a charge pump circuit configured to produce a supply voltage higher than the input voltage. The charge pump circuit is enabled in response to the second control signal being de-asserted and is clocked by the first pulsed control signal, whereby the value of the supply voltage is a function of (e.g., it is linearly dependent on, or proportional to) the first pulsed control signal. The circuit comprises a first pass element arranged between the input node and the output node. The first pass element is enabled in response to the second control signal being asserted and is selectively activated to connect the input node to the output node in response to the first pulsed control signal being asserted. The circuit comprises a second pass element arranged between the output of the charge pump circuit and the output node. The second pass element is selectively activated to connect the output of the charge pump circuit to the output node in response to the second control signal being de-asserted.

In one or more embodiments, the first feedback network comprises a low-voltage clocked comparator configured to compare the feedback signal to the reference signal, to assert the first pulsed control signal in response to the reference signal being higher than the feedback signal, and to de-assert the first pulsed control signal in response to the reference signal being lower than the feedback signal.

In one or more embodiments, the low-voltage clocked comparator comprises a plurality of dynamic (e.g., clocked) comparators clocked by respective time-shifted clock signals. The respective clock signals have the same clock period and are time shifted one with respect to the other by a fraction of the clock period. The dynamic comparators in the plurality of dynamic comparators are configured to sequentially compare the feedback signal to the reference signal to assert and de-assert respective output signals in response to the reference signal being higher and lower, respectively, than the feedback signal. The low-voltage clocked comparator comprises a monostable circuit configured to receive the output signals from the plurality of dynamic comparators and to assert the first pulsed control signal in response to assertion of any of the output signals received from the plurality of dynamic comparators.

In one or more embodiments, the low-voltage clocked comparator comprises a ring oscillator configured to produce the time-shifted clock signals for the plurality of dynamic comparators.

In one or more embodiments, the circuit comprises a first level shifter circuit arranged between the low-voltage clocked comparator and the first pass element. The first level shifter circuit is configured to shift the first pulsed control signal from a low-voltage domain to a high-voltage domain and to propagate the shifted first pulsed control signal to the first pass element in response to the second control signal being asserted.

In one or more embodiments, the first feedback network comprises a first resistance arranged in series with a first current generator between the output node and a ground node. The feedback signal is produced at a node intermediate the first resistance and the first current generator.

In one or more embodiments, the first current generator comprises a variable current generator configured to produce a variable current as a function of the value of a first digital control signal, whereby the feedback signal is shifted as a function of the first digital control signal.

In one or more embodiments, the second feedback network comprises a second resistance arranged in series with a second current generator between the input node and a ground node. The threshold signal is produced at a node intermediate the second resistance and the second current generator. The second feedback network comprises a further comparator configured to compare the regulated output voltage to the threshold signal, to assert the second control signal in response to the threshold signal being higher than the regulated output voltage, and to de-assert the second control signal in response to the threshold signal being lower than the regulated output voltage.

In one or more embodiments, the second current generator comprises a variable current generator configured to produce a variable current as a function of the value of a second digital control signal, whereby the threshold signal is shifted as a function of the second digital control signal.

In one or more embodiments, the circuit comprises an inverter circuit and a second level shifter circuit arranged between the further comparator and the second pass element to produce a complement signal of the second control signal, shift the complement signal from a low-voltage domain to a high-voltage domain, and propagate the shifted complement signal to the second pass element. The second pass element is activated in response to the shifted complement signal being asserted and is de-activated in response to the shifted complement signal being de-asserted.

In one or more embodiments, a memory device comprises an array of memory cells arranged in a plurality of bit lines and a plurality of word lines. Each memory cell is arranged in series with a respective selection transistor between a ground terminal and the corresponding bit line, and each bit line is selectively couplable to a supply voltage rail providing a regulated voltage. The memory device comprises a voltage regulator circuit according to one or more embodiments, having the output node coupled to the supply voltage rail to provide the regulated voltage thereto. The voltage regulator circuit is selectively activated to produce the regulated voltage in response to a memory read command being received by the memory device.

In one or more embodiments, the word lines are selectively couplable to the output node of the voltage regulator circuit. The memory device is configured to couple one or more unselected word lines to the output node of the voltage regulator circuit during a read operation from a selected word line in the memory device.

In one or more embodiments, a filtered output voltage is produced at the one or more unselected word lines coupled to the output node of the voltage regulator circuit. The first feedback network of the voltage regulator circuit is selectively couplable to the unselected word lines and is configured to produce the feedback signal indicative of the filtered output voltage. The second feedback network of the voltage regulator circuit is selectively couplable to the unselected word lines and is configured to compare the filtered output voltage to the threshold signal to produce the second control signal.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
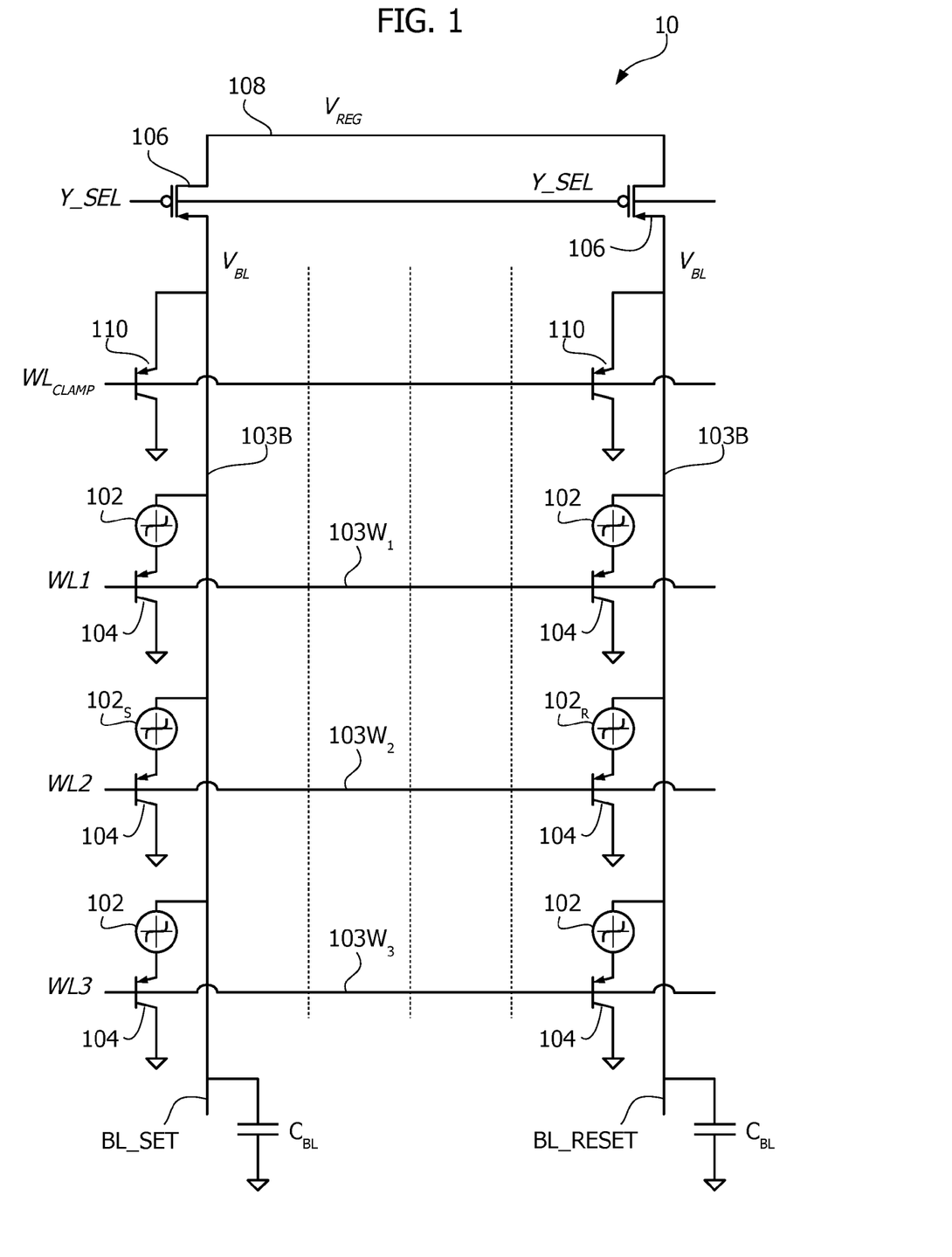
FIG. 1 is a circuit diagram exemplary of a memory architecture according to one or more embodiments of the present description.
Figure 2:
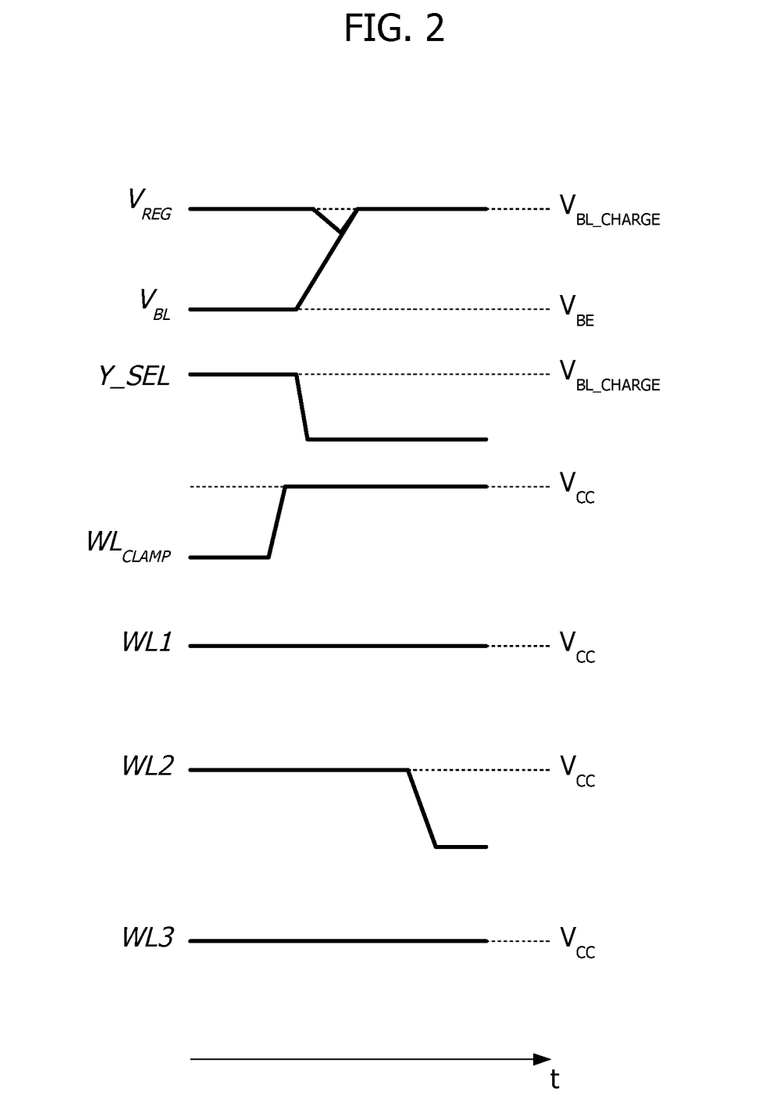
FIG. 2 is a time diagram exemplary of signals during a read operation in a memory.

By way of introduction to the detailed description of exemplary embodiments, reference may first be made to FIGS. 1 and 2. FIG. 1 is a circuit diagram exemplary of a memory reading architecture in a phase-change memory, and FIG. 2 is a time diagram exemplary of signals during a read operation in the memory of FIG. 1.

As exemplified in FIG. 1, a memory 10 may comprise an array of memory cells 102 (e.g., phase-change memory cells) arranged in bit lines 103B (here illustrated as vertical lines) and word lines $103W_1$, $103W_2$, $103W_3$ (here illustrated as horizontal lines) according to a memory architecture known per se. In particular, each memory cell 102 may be arranged in series with a respective selection transistor 104 (e.g., a pnp BJT transistor) between a ground voltage terminal and the respective bit line 103B. The selection transistors 104 of a same word line 103W receive a same control signal at their control (e.g., base) terminals, e.g., control signals $WL_1$, $WL_2$, $WL_3$ as exemplified in FIGS. 1 and 2. Each bit line 103B may be selectively coupled (e.g., via a respective p-channel MOS transistor 106 having its current path in series to the bit line and receiving a control signal Y_SEL)

to a supply voltage rail 108 that provides a regulated voltage $V_{REG}$. Additionally, respective clamping transistors 110 (e.g., pnp BJT transistors) may be coupled between each bit line 103B (e.g., at the source terminals of transistors 106) and the ground terminal. The clamping transistors 110 may receive the same control signal $WL_{CLAMP}$ at their control (e.g., base) terminals. Each bit line 103B has a respective capacitive load $C_{BL}$ due to the capacitances of the memory cells 102 and/or of the transistors 106, 110.

A read operation in a phase-change memory as exemplified in FIG. 1 may be carried out as exemplified in FIG. 2 to read (and provide as output) the content of plural PCM words on an output data bus DATA_OUT[144:0]. Generally, in a phase-change memory, information may be stored associating two cells to each bit: a SET cell (having low resistance and high current) and a RESET cell (having high resistance and low current). A memory sense circuit may read information from the cells in differential mode. In one or more embodiments, two operations may be available to read the memory content, i.e.:

read in 128-bit mode: this operation reads the content of one word (128 bits of data plus 17 bits of ECC, i.e., 145 bits in total) at a specified address. In this case, the MSB (Most Significant Bit) address is used to select the first memory back (BANK0) or the second memory back (BANK1), since the memory may include two banks. One word (145 bits) will be provided at the output data bus DATA_OUT[144:0], and 145 sense amplifiers may be provided for each memory bank;

read in 256-bit mode: this operation reads the content of two words that are stored in two different memory banks. In this case, the LSB (Least Significant Bit) address is used to select the first memory back (BANK0) or the second memory back (BANK1). The first word (128 bits of data plus 17 bits of ECC, i.e., 145 bits in total) will be provided at the output data bus DATA_OUT[144:0] after some latency ($T_{ACC}$), and the second word will be provided at the output data bus DATA_OUT[144:0] after a very short latency ($T_{ACC2}$).

It will be noted that the number of bits that are read in parallel, as well as the access time, may vary in different embodiments.

In order to provide fast reading of the memory cells, the specification for the memory access time ($T_{ACC}$) may be particularly demanding (e.g., in the order of 10 ns). As stated previously, read parallelism (e.g., reading two words in parallel) may be used to increase the throughput of the output data. As stated previously, sensing of the content of the memory cells may be carried out in differential mode: a sensing circuit reads in differential mode from the bit line BL_SET and the bit line BL_RESET, so that the SET memory cell and the RESET memory cell are selected. The SET memory cell and the RESET memory cell are selected by properly driving the control signals (word selection signals) $WL_1$, $WL_2$, $WL_3$: for instance, as exemplified in FIG. 2, by keeping signals $WL_1$ and $WL_3$ at a high logic value (e.g., equal to a supply voltage $V_{CC}$) and by driving signal WL2 to a low logic value (e.g., equal to the ground voltage) cell $102_S$ is selected as the SET cell and cell $102_R$ is selected as the RESET cell.

A voltage regulator (e.g., an LDO regulator) produces the regulated voltage $V_{REG}$ at the supply rail 108 (e.g., having an expected voltage value $V_{BL\_CHARGE}$). The value $V_{BL\_CHARGE}$ of voltage $V_{REG}$ should be high enough to provide a proper voltage stack to the bit lines to result in the correct values of the memory cells currents. Before sensing (e.g., differentially between BL_SET and BL_RESET), the voltage $V_{BL}$ at the selected bit lines is clamped to the value $V_{BE}$ of the base-emitter voltage of the clamping transistors 110, and then the bit lines are pre-charged to the value $V_{BL\_CHARGE}$ of the regulated voltage $V_{REG}$ by activating the transistors 106 (see in FIG. 2 the control signal Y_SEL switching from a high value $V_{BL\_CHARGE}$ to a low value to activate transistors 106). The control signals $WL_1$ and $WL_3$ of the unselected word lines are driven to a high voltage value (e.g., a supply voltage $V_{CC}$) so as to keep the respective selection transistors in a non-conductive state.

Due to the high read parallelism, the number of bit lines that are pre-charged to $V_{BL\_CHARGE}$ before sensing may be high. For instance, in the case of reading 148 bits (128 words + ECC + redundancy) from two bit lines (SET and RESET) with a word parallelism equal to two, the number of pre-charged bit lines is equal to 148*2*2=592. The parasitic capacitance $C_{BL}$ of each bit line may be in the range of some tens of fF (1 fF = $10^{-15}$ F) up to some hundreds of fF. During the pre-charge phase, all the pre-charged bit lines are charged from the value $V_{BE}$ (e.g., about 0.5 V) to the value $V_{BL\_CHARGE}$ (e.g., about 1.55 V). When the bit lines are connected to the supply rail 108 via the transistors 106, a relevant current flows from the supply rail 108 towards the bit lines, causing a relevant drop of the voltage $V_{REG}$ whose value decreases from the regulated value $V_{BL\_CHARGE}$ (see again FIG. 2). In various applications, such a voltage drop of the regulated voltage $V_{REG}$ has to be recovered in a short recovery time ($T_{REC}$) to provide a short access time ($T_{ACC}$) as discussed above. Considering a recovering time $T_{REC}$ having an exemplary value of about 2 ns or 3 ns, the voltage regulator that supplies the supply rail 108 may be demanded to provide a peak current $I_{peak}$ equal to:

$$I_{peak} = \frac{N_{BL} \cdot C_{BL} \cdot (V_{BL\_CHARGE} - V_{BE})}{T_{REC}} \approx \frac{592 \cdot 113 \; fF \cdot 1.0 V}{2 \; ns} \approx 35 \; mA$$

Therefore, the (LDO) voltage regulator should be able to provide a high current with a fast response time.

Another issue that may be relevant is related to the wide supply voltage range and in particular to the lower supply voltage value, which may be lower than the regulated value. For instance, if the minimum value $V_{CC,MIN}$ of the supply voltage $V_{CC}$ is about 1.62 V, $V_{BL\_CHARGE}$ may be lower than $V_{CC,MIN}$ in typical cases but higher than $V_{CC,MIN}$ in some corner cases (e.g., slow silicon and high temperature) to compensate the selector and cell variations. Additionally, the value $V_{BL\_CHARGE}$ could be set higher to provide higher SET currents and reduce read fails. Therefore, the (LDO) voltage regulator may be demanded to provide the correct output voltage even if the supply voltage $V_{CC}$ is lower than the expected regulated voltage $V_{BL\_CHARGE}$.

Figure 3:
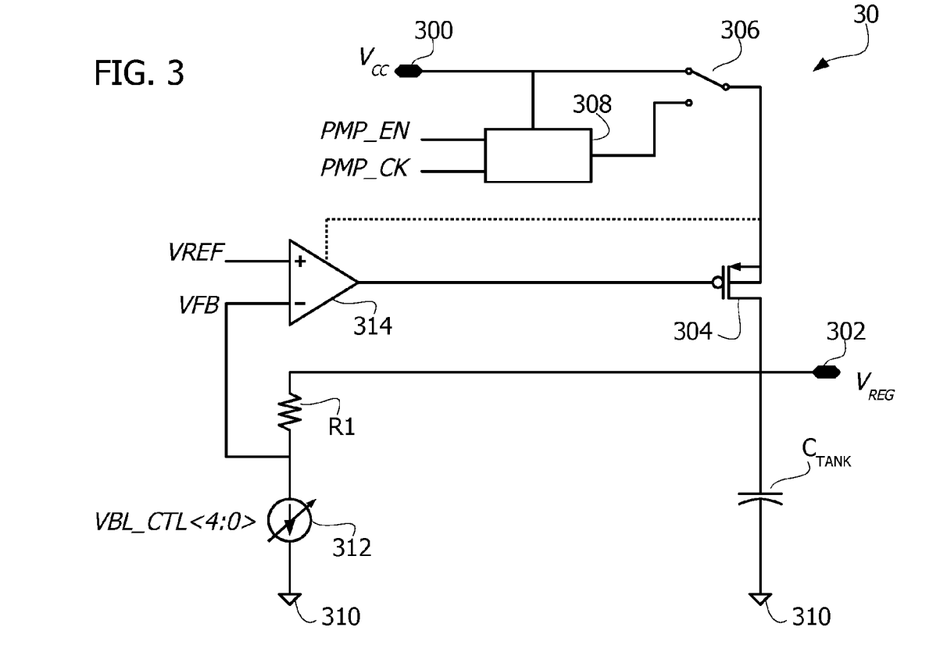
FIG. 3 is a circuit diagram exemplary of a voltage regulator circuit, particularly a low-dropout voltage regulator circuit.

FIG. 3 is a circuit diagram exemplary of the circuit architecture of an LDO voltage regulator 30 for use in a memory device. In particular, the regulator comprises an input node 300 configured to receive an input voltage Vcc (e.g., in the range of 1.6 V to 3.6 V) and an output node 302 configured to provide a regulated output voltage $V_{REG}$ (e.g., in the range of 1.6 V to 1.8 V). A pass element 304 (e.g., a p-channel MOS transistor) provides a current path between the input node 300 and the output node 302, whose conductivity can be modulated as a function of a control signal applied to the pass element 304 (e.g., to the gate of transistor 304). By means of a selector 306 (e.g., a pair of switches), the terminal of the pass element 304 opposed to the output node 302 (e.g., the source terminal of transistor 304) can be either directly connected to the input node 300 (when the input voltage $V_{CC}$ is higher than the output voltage $V_{REG}$ that the regulator 30 is expected to provide), or can be coupled to the output of a charge pump circuit 308 (when the input voltage $V_{CC}$ is lower than the output voltage $V_{REG}$). The charge pump circuit 308, which is also coupled to the input node 300 to receive therefrom the input voltage $V_{CC}$, may receive an enabling signal PMP_EN and a clock signal PMP_CK and may produce an output voltage higher than $V_{CC}$ as a function of signals PMP_EN and PMP_CK in a manner known per se. A large tank capacitance $C_{TANK}$ is coupled between the output node 302 and the ground node 310 and provides a charge reservoir to reduce undershoot of the output voltage $V_{REG}$.

The LDO regulator 30 also comprises a feedback network to produce the control signal for the pass element 304. In particular, the feedback network comprises a resistor R1 arranged in series with a variable current generator 312 between the output node 302 and the ground node 310. The amount of current generated by the current generator 312 may depend on a digital control signal VBL_CTL<4:0>. The node intermediate the resistor R1 and the current generator 312 may thus provide a feedback signal VFB that is provided at the inverting input of a high-voltage comparator 314. A reference voltage signal VREF is provided at the non-inverting input of the comparator 314. The comparator may receive a supply voltage from the node intermediate the pass element 304 and the selector 306, i.e., may receive either the supply voltage Vcc or the supply voltage produced by the charge pump 308, depending on the state of the selector 306. The output signal from the comparator 314 is provided as a control signal to the pass element 304.

Therefore, in the LDO architecture exemplified in FIG. 3, a big selector 306 (e.g., two big switches) is necessary to connect the input of the pass element 304 and the supply node of the comparator 314 to the input node 300 or to the output of the charge pump 308 (depending on the state of the selector 306, which depends on the difference between the values of $V_{CC}$ and $V_{REG}$). Also, a voltage detector is necessary to correctly operate the selector 306.

Figure 4:
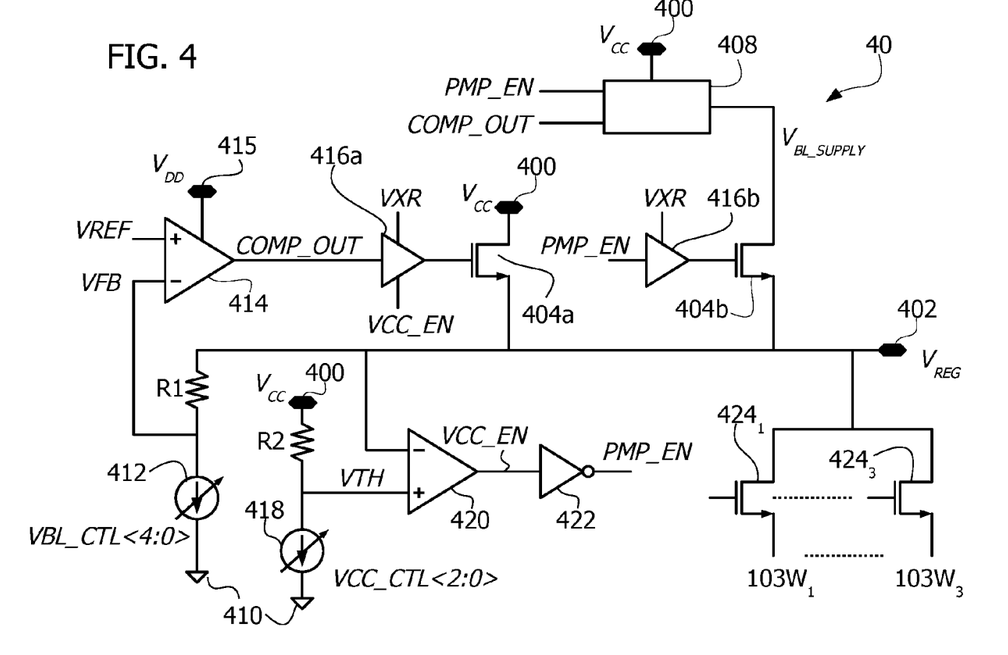
FIG. 4 is a circuit diagram exemplary of a voltage regulator circuit according to one or more embodiments of the present description, particularly a low-dropout voltage regulator circuit.

One or more embodiments may rely on a different LDO voltage regulator architecture 40 as exemplified in FIG. 4, also referred to as on/off LDO regulator with integrated charge pump, which is also suitable for use in a memory device 10 as exemplified in FIG. 1.

In particular, in one or more embodiments a voltage regulator 40 comprises an input node 400 configured to receive an input voltage $V_{CC}$ (e.g., in the range of 1.6 V to 3.6 V) and an output node 402 configured to provide a regulated output voltage $V_{REG}$ (e.g., in the range of 1.6 V to 1.8 V).

One or more embodiments may comprise a first pass element 404a (e.g., an electronic switch, more specifically an n-channel MOS transistor) arranged between the input node 400 and the output node 402. When enabled, the first pass element 404a is selectively activatable (e.g., in an on-off manner) to provide a low-impedance current path between the input node 400 and the output node 402. The first pass element 404a may be enabled in response to the input voltage $V_{CC}$ being higher than the output voltage $V_{REG}$ that the regulator 40 is expected to provide, possibly by a margin $\Delta V$. Purely by way of example, the channel of transistor 404a may have a width of about 200 μm and a length of about 0.3 μm.

One or more embodiments may comprise a first feedback network configured to produce a control signal COMP_OUT that controls the first pass element 404a. In particular, the first feedback network may comprise a resistance R1 (e.g., a resistor) arranged in series with a variable current generator 412 between the output node 402 and a ground node 410. The amount of current generated by the current generator 412, and thus the voltage drop across resistance R1, may depend on a digital control signal VBL_CTL<4:0> (e.g., a 5-bit signal). The node intermediate the resistance R1 and the current generator 412 may thus provide a feedback signal VFB that is fed to the inverting input of a low-voltage, high-speed comparator 414. A reference voltage signal VREF is fed to the non-inverting input of the comparator 414. The comparator 414 may receive from node 415 a supply voltage $V_{DD}$ that is lower than the supply voltage $V_{CC}$ at node 400 (for instance, $V_{DD}$ may be a power supply voltage in the range of 0.81 V to 1.15 V for low voltage transistors, and $V_{CC}$ may be a power supply voltage in the range of 1.62 V to 3.6 V for high voltage transistors).

In one or more embodiments, the output signal COMP_OUT from the comparator 414 is provided as a control signal to the first pass element 404a via a level shifter circuit 416a. The level shifter circuit 416a may receive a positive supply voltage VXR and a control signal VCC_EN produced by a second feedback network of the regulator circuit 40, and may be configured to shift the low voltage level from the output of comparator 414 to the VXR voltage domain. In particular, the level shifter 416a may be activated (e.g., turned on) in response to the control signal VCC_EN being asserted (e.g., set to '1'). When turned on, the level shifter 416a shifts the signal COMP_OUT from the $V_{DD}$ voltage domain level (e.g., 0.81 V to 1.15 V) to the VXR voltage domain level (e.g., 3.6 V). The level shifter 416a may be deactivated (e.g., turned off) in response to the control signal VCC_EN being de-asserted (e.g., set to '0'), thereby forcing the gate of transistor 404a to a low value (e.g., 0 V) to turn it off.

In response to the control signal VCC_EN being asserted, the control signal COMP_OUT may thus be propagated to the control terminal of the first pass element 404a (e.g., to the gate terminal of transistor 404a), so that the first pass element 404a is activatable, depending on signal COMP_OUT, when $V_{CC}$ is higher than the expected output voltage $V_{BL\_CHARGE}$ plus a certain voltage margin $\Delta V$ ($V_{CC} > V_{BL\_CHARGE} + \Delta V$). The gate of transistor 404a may be clocked to voltage VXR at a very high frequency, since comparator 414 operates at a high speed. The supply voltage VXR may be produced by a charge pump circuit regulated to a value higher than or equal to the maximum value of $V_{CC}$ (e.g., VXR = 3.6 V ≥ $V_{CC,MAX}$).

One or more embodiments may comprise a charge pump circuit 408 coupled to the input node 400 to receive therefrom the input voltage $V_{CC}$. The charge pump circuit 408 may receive an enabling signal PMP_EN and the control signal COMP_OUT and may produce an output voltage $V_{BL\_SUPPLY}$ higher than $V_{CC}$ as a function of signals PMP_EN and COMP_OUT as disclosed in the following. In particular, the charge pump 408 may be switched on (respectively, off) as a function of the enabling signal PMP_EN being asserted (respectively, de-asserted), while the ON/OFF switching activity of the clock phases of the output stages of the charge pump 408 may be controlled by signal COMP_OUT. Therefore, in one or more embodiments the charge pump 408 may not be provided with a dedicated regulator, insofar as it may rely on (e.g., use) the (very fast) comparator 414 instead.

One or more embodiments may comprise a second pass element 404b (e.g., an electronic switch, more specifically an n-channel MOS transistor) arranged between the output of the charge pump circuit 408 and the output node 402. The second pass element 404b is selectively activatable (e.g., in an on-off manner) to provide a low-impedance current path between the output of the charge pump circuit 408 and the output node 402. The second pass element 404b may be activated (e.g., switched to an ON state) in response to the input voltage $V_{CC}$ being lower than the output voltage $V_{REG}$ that the regulator 40 is expected to provide. Purely by way of example, the channel of transistor 404b may have a width of about 200 µm and a length of about 0.36 µm.

Therefore, in one or more embodiments switching of the output node 402 between voltage $V_{CC}$ (received from node 400 via pass element 404a) and voltage $V_{BL\_SUPPLY}$ (received from circuit 408 via pass element 404b) may be managed dynamically.

One or more embodiments may comprise a second feedback network configured to produce the control signals PMP_EN and VCC_EN. In particular, the second feedback network comprises a resistance R2 (e.g., a resistor) arranged in series with a variable current generator 418 between the input node 400 and the ground node 410. The amount of current generated by the current generator 418, and thus the voltage drop across resistance R2, may depend on a digital control signal VCC_CTL<2:0> (e.g., a 3-bit signal). The node intermediate the resistance R2 and the current generator 418 may thus provide a threshold signal VTH that is fed to the non-inverting input of a comparator 420. The output voltage $V_{REG}$ is fed to the inverting input of the comparator 420. The comparator 420 produces as output the control signal VCC_ENby comparing VTH to $V_{REG}$. An inverter circuit 422 receives the control signal VCC_EN as input and produces the control signal PMP_EN as the complement of signal VCC_EN.

In one or more embodiments, the control signal PMP_EN is provided as a control signal to the second pass element 404b via a level shifter circuit 416b. The level shifter circuit 416b may receive the positive supply voltage VXR and may be configured to shift the low voltage level from the output of comparator 420 to the VXR voltage domain. The control signal PMP_EN may thus be propagated to the control terminal of the second pass element 404b (e.g., to the gate terminal of transistor 404b), so that the second pass element 404b is activated when $V_{CC}$ is lower than the expected output voltage $V_{BL\_CHARGE}$ plus a certain voltage margin $\Delta V$ ($V_{CC} < V_{BL\_CHARGE} + \Delta V$). The gate of transistor 404b may be forced to voltage VXR when signal PMP_EN is asserted, and the value $V_{BL\_CHARGE}$ of the output voltage $V_{REG}$ may be regulated directly by the output $V_{BL\_SUPPLY}$ of the charge pump circuit 408.

In one or more embodiments, at power-up, the output voltage VREG may be driven to its regulated value $V_{BL\_CHARGE}$ till when a control signal VBL_OK is asserted (e.g., set to '1'). The output voltage $V_{REG}$ may be kept at its regulated value $V_{BL\_CHARGE}$ either by voltage $V_{CC}$ or by voltage $V_{BL\_SUPPLY}$. As a result of the enabling signal PMP_EN being asserted (e.g., being set to '1'), the charge pump circuit 408 and the driver (i.e., the level shifter 416b and the pass element 404b) coupled between the pump 408 and the output node 402 may be switched on. The value of digital signal VCC_CTL<2:0> may be set to 2, so that the charge pump circuit is switched on when $V_{CC} - V_{REG} \approx 80$ mV.

In one or more embodiments, the charge pump circuit 408 may not be provided with an internal voltage regulator. The output stages may thus be directly controlled by the output of the comparator 414.

Additionally, one or more embodiments may not comprise a dedicated tank capacitor $C_{TANK}$ coupled between the output node 402 and the ground node 410. A large tank capacitance may be provided at the output node 402 by selectively connecting, during the read operations in the memory 10, all the unselected word lines (e.g., word lines 103W$_1$ and 103W$_3$ according to the example of FIGS. 1 and 2) of all the memory sectors to the output node 402 via respective switches 424$_1$, ..., 424$_3$. For instance, the switches 424$_1$, ..., 424$_3$ may comprise n-channel MOS transistors. In case the selection transistors 104 in the memory 10 are pnp BJT transistors (conductive when the respective control signal WL$_1$, WL$_2$ or WL$_3$ is low), each n-channel MOS transistor 424$_1$, ..., 424$_3$ may receive the respective control signal WL$_1$, WL$_2$ or WL$_3$ at the gate terminal. Purely by way of example, in a memory architecture including 8 memory sectors, 4 tiles for each sector, and 1056 word lines for each tile, and considering that the capacitance $C_{WL}$ of each word line is approximately equal to 180 fF, the total capacitance couplable to node 402 via the switches 424 may be approximately equal to 8*4*1056*180 fF ≈ 6 nF.

Figure 5A:
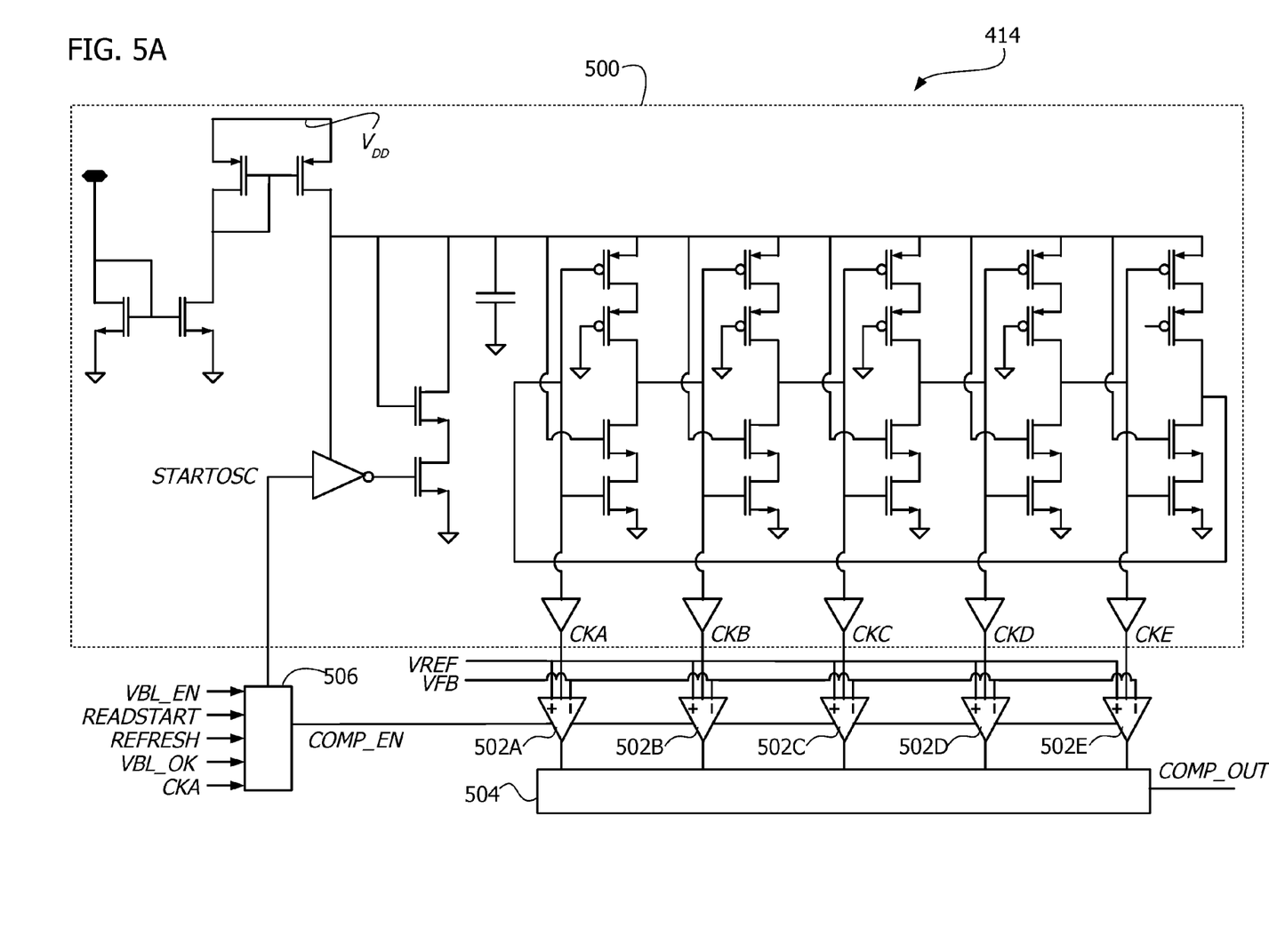
FIGS. 5A, 5B and 5C are circuit diagrams exemplary of possible implementation details of voltage regulator circuits according to one or more embodiments of the present description.
Figure 5B:
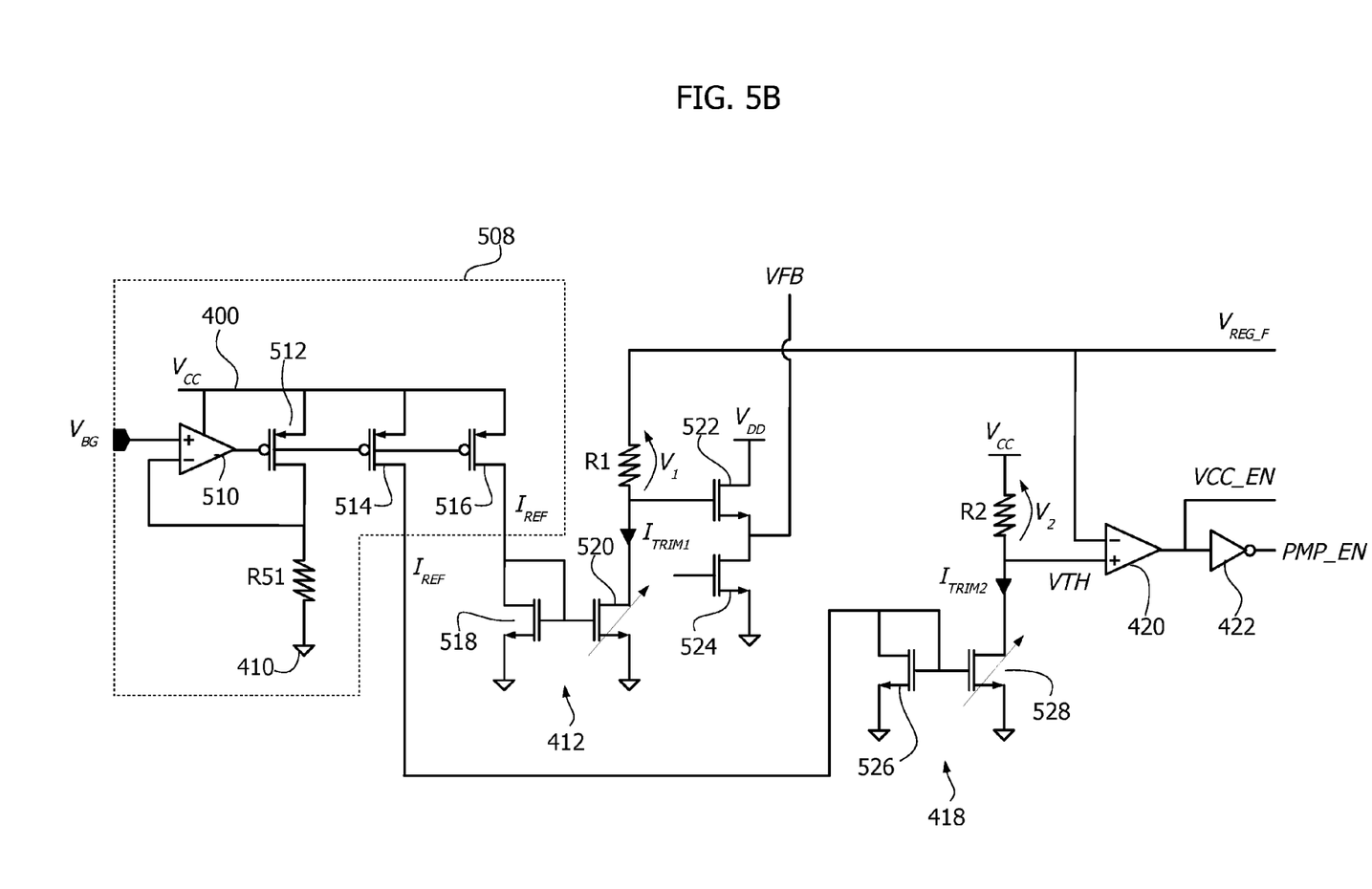
Figure 5C:
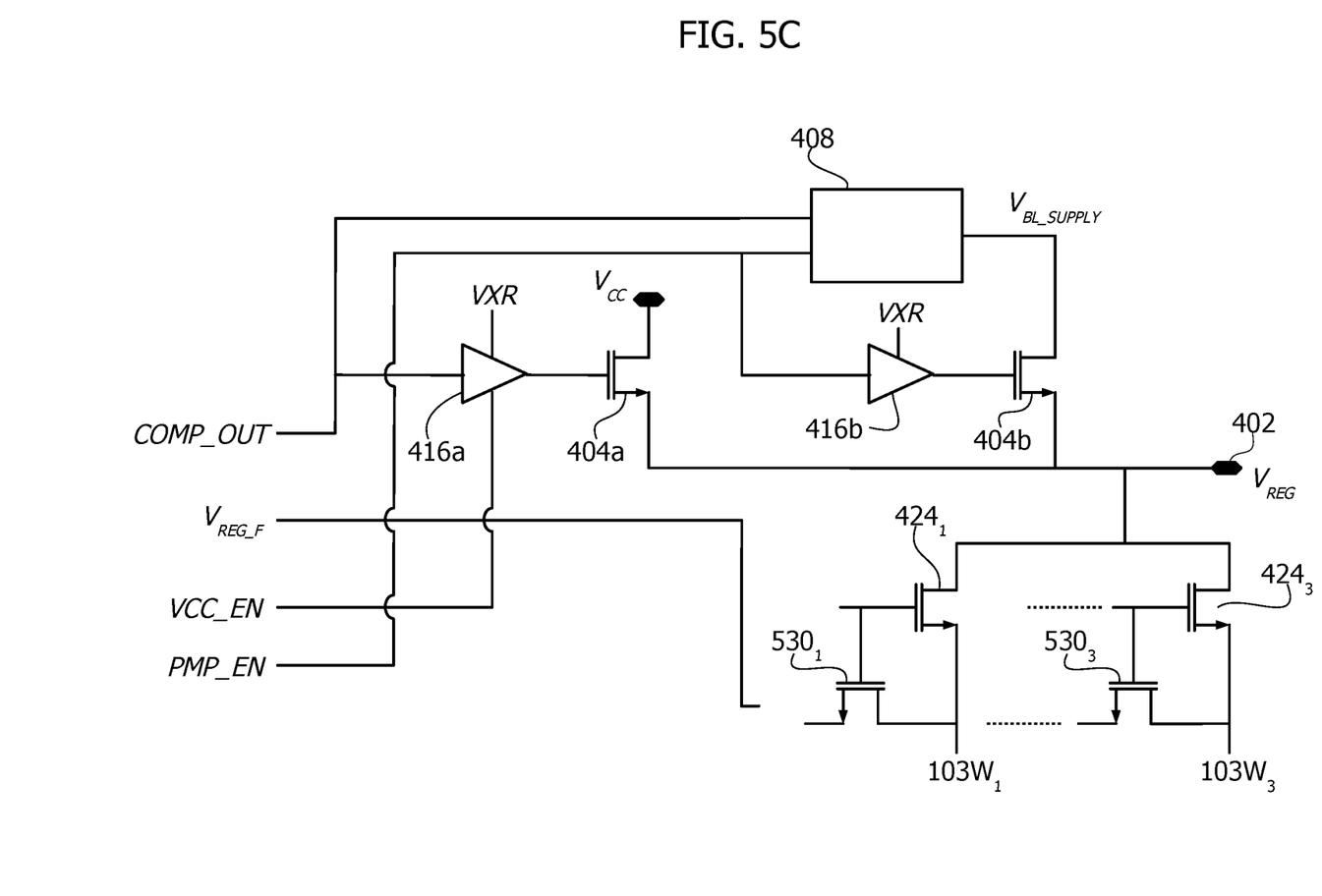

FIGS. 5A, 5B and 5C are circuit diagrams exemplary of possible implementation details of a voltage regulator circuit 40 according to one or more embodiments.

In particular, FIG. 5A is exemplary of a possible implementation of comparator 414 in one or more embodiments. Comparator 414 may comprise a high frequency ring oscillator 500 providing M different clock signals (or clock phases) CKA, CKB, CKC, CKD, CKE (e.g., five clock signals). Each clock signal may be delayed by a fraction 1/M (e.g., one fifth) of the ring oscillator period $T_{OSC}$ with respect to the preceding one. For instance, if the frequency of ring oscillator 500 is approximately 800 MHz, then $T_{OSC}$ is approximately 1.25 ns. Each of clock signals CKA, CKB, CKC, CKD, CKE may have a period of 1.25 ns, with signal CKB being delayed by 0.25 ns with respect to signal CKA, signal CKCbeing delayed by 0.25 ns with respect to signal CKB, and so on until signal CKA being delayed by 0.25 ns with respect to signal CKE. Each of the clock signals produced by the ring oscillator 500 may be used to clock a respective dynamic comparator 502A, ..., 502E. The comparators 502A, ..., 502E may thus operate sequentially in a quasi-continuous mode, with each comparator 502A, ..., 502E being activated for a time period equal to $T_{OSC}$/M (e.g., $T_{OSC}$/5) and with the comparators 502A, ..., 502E being activated one after the other according to a "rotation" mechanism. The comparators 502A, ..., 502E may be provided with offset compensation circuitry. Each of comparators 502A, ..., 502E may receive the reference signal VREF at a respective non-inverting input and the feedback signal VFB at a respective inverting input. The dynamic comparators 502A, ..., 502E and the ring oscillator 500 may operate in a low supply voltage domain (e.g., 0.8 V to 1.15 V), so that low voltage transistors can be used and very high frequency can be reached. Use of an ultra-high speed comparator 414 as exemplified in FIG. 5A, which relies on a high frequency ring oscillator 500 with very fast start/stop operation and temperature compensation, is thus advantageous insofar as the speed of the regulator 40 may depend mainly on the speed of comparator 414.

As exemplified in FIG. 5A, in one or more embodiments the output signals from comparators 502A, ..., 502E are fed to a monostable circuit 504 that produces the control signal COMP_OUT. The assertion and de-assertion of signal COMP_OUT depends on the values of signals VREF and VFB at the input of the dynamic comparators 502. In response to VFB being lower than VREF, signal COMP_-OUT will be asserted (e.g., set to '1') and the pass element 404a will supply current to the output node 402. In particular, the monostable circuit 504 may be configured to generate a pulse in the output signal COMP_OUT in response to a pulse being received from any of the dynamic comparators 502A, ..., 502E. In some cases, generating one pulse in the output signal COMP_OUT may be sufficient to restore the expected value of the regulated voltage $V_{REG}$, so only one pulse is passed from the comparators 502A, ..., 502E through the monostable circuit 504. In other cases, two or more pulses may be necessary to restore the expected value of the regulated voltage $V_{REG}$, so the output signal COMP_-OUT may be generated by "merging" the pulses received from the comparators. Therefore, circuit 504 operates as a monostable circuit insofar as it generates a stable output pulse that may be the composition of a plurality of input pulses (one or more).

One or more embodiments may comprise a logic circuit 506 configured to control the switching activity of the ring oscillator 500 and of the comparators 502 based on read commands issued towards a memory. In particular, the ring oscillator 500 and the comparators 502 may be activated when a read command is issued (e.g., a read signal READ-START is asserted or set to '1'). The ring oscillator 500 and the comparators 502 may be refreshed (e.g., periodically) by a low frequency trimmable clock signal. The logic circuit 506 may produce an enabling signal COMP_EN for the comparators 502A, ..., 502E and a start signal STARTOSC for the oscillator 500 as a function of one or more of signals VBL_EN, READSTART, REFRESH, VBL_OK and CKA. In particular, signal COMP_EN may be asserted (e.g., set to '1') in response to signal VBL_EN being asserted (e.g., set to '1') indicating that the voltage regulator 40 is ON after power-on and signal VBL_OK being asserted (e.g., set to '1') indicating that signal VREFis pre-charged to its steady state at power-on by another circuitry. After power-on, signals VBL_EN and VBL_OK are expected to remain asserted. Additionally, signal COMP_EN may be asserted when a pulse is generated in signal READSTART (indicating that a read command is issued). Signal COMP_EN may remain asserted for a certain time interval, e.g., depending on the state of a shift register clocked by one of the clock phases of the oscillator 500, e.g., clock signal CKA. Therefore, the voltage regulator 40 may be switched ON (only) for a reduced period necessary to perform a memory read operation. Signal REFRESH may be used to refresh the $V_{REG}$ signal (e.g., periodically insofar as it is a clocked structure).

FIG. 5B is exemplary of a possible implementation of the feedback networks that produce signals VFB, VCC_EN and PMP_EN.

As exemplified in FIG. 5B, one or more embodiments may comprise a reference current generator circuit 508. The circuit 508 may comprise an operation amplifier 510 that produces a gate control signal for transistors 512, 514 and 516 (e.g., p-channel MOS transistors). Transistor 512 may have a certain width 10*W, a gate terminal coupled to the output of amplifier 510, a source terminal coupled to the supply node 400 to receive the supply voltage $V_{CC}$, and a drain terminal coupled to a first terminal of a resistance R51 (e.g., a 123 kΩ resistor). The second terminal of resistance R51 may be coupled to the ground node 410. The non-inverting input of amplifier 510 may receive a bandgap reference voltage VBG and the inverting input of amplifier 510 may be coupled to a node intermediate transistor 512 and resistance R51. Transistors 514 and 516 may have a certain width W (e.g., one tenth of the width of transistor 512), respective gate terminals coupled to the output of amplifier 510, respective source terminals coupled to the supply node 400 to receive the supply voltage $V_{CC}$, and respective drain terminals configured to provide output currents $I_{REF}$. Due to the dimensioning of transistors 512, 514 and 516 the value of current $I_{REF}$ may be equal to:

$$I_{REF} \frac{V_{BG}}{R51} \cdot \frac{1}{10} \sim 1 \mu A$$

As exemplified in FIG. 5B, the variable current generator 412 may comprise an adjustable current mirror arrangement including transistors 518, 520 and configured to mirror the current $I_{REF}$ output from transistor 516. In particular, the current mirror may comprise an n-channel MOS transistor 518 in transdiode configuration coupled to a variable n-channel MOS transistor 520 (e.g., a set of selectively activatable transistors 520 arranged in parallel) controlled by signal VBL_GTL<4:0>. Each bit of signal VBL_CTL<4:0> may control (e.g., switch ON/OFF) one of transistors 520 of the current mirror. In particular, variable transistor 520 may comprise (or consist of) five transistors, one for each bit of signal VBL_CTL<4:0>. By controlling the value on the bus VBL_GTL<4:0>, the current flowing through resistance R1 and the voltage drop $V_1$, on resistance R1 can be controlled. Resistances R1 and R51 may be matched. The voltage $V_1$ across resistance R1 (e.g., a 40 kΩ resistance) may thus be computed as:

$$V_1 = I_{TRIM1} \cdot R1 = I_{REF} \cdot VBL\_CTL < 4:0 > \cdot$$
$$R_1 = V_{BG} \cdot \frac{R1}{R51} \cdot \frac{VBL\_CTL < 4:0 >}{10}$$

By controlling the current $I_{TRIM1}$ (with signal VBL_GTL<4:0>) it is possible to control the feedback signal VFB and therefore the regulated voltage $V_{REG}$.

One or more embodiments may comprise two transistors (e.g., n-channel MOS transistors) 522 and 524 coupled in series between the low-voltage supply node 415 to receive voltage $V_{DD}$ and the ground node. The gate of transistor 522 may be coupled to a node intermediate transistor 520 and resistance R1, and the feedback signal VFB may be produced at a node intermediate transistors 522 and 524. The transistors 522 and 524 may thus shift down the voltage at the gate of transistor 522. Also signal VREF may be shifted of the same amount.

As exemplified in FIG. 5B, the variable current generator 418 may comprise an adjustable current mirror arrangement including transistors 526, 528 and configured to mirror current $I_{REF}$ output from transistor 514. In particular, the current mirror may comprise an n-channel MOS transistor 526 in transdiode configuration coupled to a variable n-channel MOS transistor 528 (e.g., a set of selectively activatable transistors 528 arranged in parallel) controlled by signal VCC_GTL<2:0>. Each bit of signal VCC_CTL<2:0> may control (e.g., switch ON/OFF) one of transistors 528 of the current mirror. In particular, variable transistor 528 may comprise (or consist of) three transistors, one for each bit of signal VCC_CTL<2:0>. By controlling the value on the bus VCC_CTL<2:0>, the current flowing through resistance $R_2$ and the voltage drop $V_2$ on resistance $R_2$ can be controlled. Resistances $R_2$ and R51 may be matched. The voltage $V_2$ across resistance $R_2$ (e.g., a 40 kΩ resistance) may thus be computed as:

$$V_2 = I_{TRIM2} \cdot R2 = I_{REF} \cdot VCC\_CTL<2:0> \cdot$$
$$R_2 = V_{BG} \cdot \frac{R2}{R51} \cdot \frac{VCC\_CTL<2:0>}{10}$$

By controlling the current $I_{TRIM2}$ (with signal VCC_CTL<2:0>) it is possible to control the threshold signal VTH and therefore the threshold voltage at which the charge pump 408 is switched ON.

As exemplified in FIGS. 5B and 5C, in one or more embodiments the first and second feedback networks of the regulator 40 may not be directly coupled to the output node 402 to receive voltage $V_{REG}$ (as shown in the simplified scheme of FIG. 4). Instead, the feedback networks may be coupled to the unselected word lines of the memory array (e.g., via transistors $530_1$, ..., $530_3$) to receive a voltage signal $V_{REG\_F}$, substantially corresponding to the supply voltage $V_{REG}$ as filtered by the capacitive load of the unselected word lines. Advantageously, such an arrangement may also prevent undesired switching.

One or more embodiments of an LDO voltage regulator as exemplified herein may thus have a fast response time, e.g., resorting to high speed dynamic comparators 502A, ..., 502E in the comparator 414.

Additionally, one or more embodiments may provide high accuracy by resorting to offset compensation for the comparators 502A, ..., 502E.

Additionally, in one or more embodiments a large capacitance may be selectively coupled at the output node 402 of the voltage regulator by coupling thereto the unselected word lines (e.g., via switches 424) of a memory device to which the voltage regulator is coupled. Such arrangement facilitates providing a fast (e.g., almost instantaneous) current during the pre-charge phase without the need of resorting to a large, dedicated tank capacitance, thereby saving layout area (e.g., silicon area).

Additionally, one or more embodiments may comprise a charge pump circuit 408 integrated in the voltage regulator 40. The charge pump circuit 408 may be directly regulated by the output of dynamic comparator 414, resulting in a fast control and response time, as well as a reduction of the layout area insofar as the pump circuit 408 does not need a dedicated comparator, feedback circuit and related circuitry.

Additionally, one or more embodiments may provide a dynamic architecture for switching between the supply voltage $V_{CC}$ and supply voltage $V_{BL\_SUPPLY}$ produced by the pump 408, resulting in a reduction of the layout area insofar as a lower number of big switches (e.g., selectors) and related circuitry is needed. The dynamic switching architecture also results in a reduced current consumption and a higher efficiency of the charge pump circuit 408 insofar as there is no need to regulate the charge pump circuit 408 at a high voltage value. The dynamic switching architecture also allows to trim the difference $\Delta V$ between the supply voltage $V_{CC}$ and the regulated voltage $V_{REG}$, resulting in a higher degree of flexibility of the architecture and increased adaptability to different specifications (e.g., charge/discharge voltage supply ramp rate). In one or more embodiments, hysteresis is introduced to avoid undesired switching.

Additionally, in one or more embodiments an on/off architecture facilitates limited and controlled standby current consumption and quiescent current consumption.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:
an input node configured to receive an input voltage;
an output node configured to produce a regulated output voltage;
a first feedback network configured to produce a feedback signal indicative of the regulated output voltage, and compare the feedback signal to a reference signal to produce a first pulsed control signal, wherein the first pulsed control signal is asserted in response to the reference signal being higher than the feedback signal and de-asserted in response to the reference signal being lower than the feedback signal, whereby a time-averaged value of the first pulsed control signal is a function of a difference between the reference signal and the feedback signal;
a second feedback network configured to produce a threshold signal indicative of the input voltage, and compare the regulated output voltage to the threshold signal to produce a second control signal, wherein the second control signal is asserted in response to the threshold signal being higher than the regulated output voltage and de-asserted in response to the threshold signal being lower than the regulated output voltage;
a charge pump circuit configured to produce a supply voltage higher than the input voltage, wherein the charge pump circuit is enabled in response to the second control signal being de-asserted and is clocked by the first pulsed control signal, whereby a value of the supply voltage is a function of the first pulsed control signal;
a first pass element arranged between the input node and the output node, wherein the first pass element is enabled in response to the second control signal being asserted and is selectively activated to connect the input node to the output node in response to the first pulsed control signal being asserted; and
a second pass element arranged between an output of the charge pump circuit and the output node, wherein the second pass element is selectively activated to connect the output of the charge pump circuit to the output node in response to the second control signal being de-asserted.

2. The circuit of claim 1, wherein the first feedback network comprises a low-voltage clocked comparator configured to compare the feedback signal to the reference signal, to assert the first pulsed control signal in response to the reference signal being higher than the feedback signal, and to de-assert the first pulsed control signal in response to the reference signal being lower than the feedback signal.

3. The circuit of claim 2, wherein the low-voltage clocked comparator comprises:
a plurality of dynamic comparators clocked by respective time-shifted clock signals, wherein the respective clock signals have a same clock period and are time shifted one with respect to the other by a fraction of the same clock period, wherein the dynamic comparators in the plurality of dynamic comparators are configured to sequentially compare the feedback signal to the reference signal to assert and de-assert respective output signals in response to the reference signal being higher and lower, respectively, than the feedback signal; and
a monostable circuit configured to receive the output signals from the plurality of dynamic comparators and to assert the first pulsed control signal in response to assertion of any of the output signals received from the plurality of dynamic comparators.

4. The circuit of claim 3, wherein the low-voltage clocked comparator comprises a ring oscillator configured to produce the time-shifted clock signals for the plurality of dynamic comparators.

5. The circuit of claim 2, comprising a first level shifter circuit arranged between the low-voltage clocked comparator and the first pass element, the first level shifter circuit being configured to shift the first pulsed control signal from a low-voltage domain to a high-voltage domain and to propagate the shifted first pulsed control signal to the first pass element in response to the second control signal being asserted.

6. The circuit of claim 1, wherein the first feedback network comprises a first resistance arranged in series with a first current generator between the output node and a ground node, wherein the feedback signal is produced at a node intermediate the first resistance and the first current generator.

7. The circuit of claim 6, wherein the first current generator comprises a variable current generator configured to produce a variable current as a function of a value of a first digital control signal, whereby the feedback signal is shifted as a function of the first digital control signal.

8. The circuit of claim 1, wherein the second feedback network comprises:
a second resistance arranged in series with a second current generator between the input node and a ground node, wherein the threshold signal is produced at a node intermediate the second resistance and the second current generator, and
a further comparator configured to compare the regulated output voltage to the threshold signal, to assert the second control signal in response to the threshold signal being higher than the regulated output voltage, and to de-assert the second control signal in response to the threshold signal being lower than the regulated output voltage.

9. The circuit of claim 8, wherein the second current generator comprises a variable current generator configured to produce a variable current as a function of a value of a second digital control signal, whereby the threshold signal is shifted as a function of the second digital control signal.

10. The circuit of claim 8, comprising an inverter circuit and a second level shifter circuit arranged between the further comparator and the second pass element to produce a complement signal of the second control signal, shift the complement signal from a low-voltage domain to a high-voltage domain, and propagate the shifted complement signal to the second pass element, wherein the second pass element is activated in response to the shifted complement signal being asserted and is de-activated in response to the shifted complement signal being de-asserted.

11. A memory device, comprising:
an array of memory cells arranged in a plurality of bit lines and a plurality of word lines, wherein each memory cell is arranged in series with a respective selection transistor between a ground terminal and the corresponding bit line, and each bit line is selectively couplable to a supply voltage rail; and
a voltage regulator circuit comprising:
an input node configured to receive an input voltage;
an output node coupled to the supply voltage rail to provide a regulated output voltage thereto;
a first feedback network configured to produce a feedback signal indicative of the regulated output voltage, and compare the feedback signal to a reference signal to produce a first pulsed control signal, wherein the first pulsed control signal is asserted in response to the reference signal being higher than the feedback signal and de-asserted in response to the reference signal being lower than the feedback signal, whereby a time-averaged value of the first pulsed control signal is a function of a difference between the reference signal and the feedback signal;
a second feedback network configured to produce a threshold signal indicative of the input voltage, and compare the regulated output voltage to the threshold signal to produce a second control signal, wherein the second control signal is asserted in response to the threshold signal being higher than the regulated output voltage and de-asserted in response to the threshold signal being lower than the regulated output voltage;
a charge pump circuit configured to produce a supply voltage higher than the input voltage, wherein the charge pump circuit is enabled in response to the second control signal being de-asserted and is clocked by the first pulsed control signal, whereby a value of the supply voltage is a function of the first pulsed control signal;
a first pass element arranged between the input node and the output node, wherein the first pass element is enabled in response to the second control signal being asserted and is selectively activated to connect the input node to the output node in response to the first pulsed control signal being asserted; and
a second pass element arranged between an output of the charge pump circuit and the output node, wherein the second pass element is selectively activated to connect the output of the charge pump circuit to the output node in response to the second control signal being de-asserted;
wherein the voltage regulator circuit is selectively activated to produce the regulated output voltage in response to a memory read command being received by the memory device.

12. The memory device of claim 11, wherein the word lines are selectively couplable to the output node of the voltage regulator circuit, the memory device being configured to couple one or more unselected word lines to the output node of the voltage regulator circuit during a read operation from a selected word line in the memory device.

13. The memory device of claim 12, wherein:
a filtered output voltage is produced at the one or more unselected word lines coupled to the output node of the voltage regulator circuit;
the first feedback network of the voltage regulator circuit is selectively couplable to the unselected word lines and is configured to produce the feedback signal indicative of the filtered output voltage; and
the second feedback network of the voltage regulator circuit is selectively couplable to the unselected word lines and is configured to compare the filtered output voltage to the threshold signal to produce the second control signal.

14. The memory device of claim 11, wherein the first feedback network comprises a low-voltage clocked comparator configured to compare the feedback signal to the reference signal, to assert the first pulsed control signal in response to the reference signal being higher than the feedback signal, and to de-assert the first pulsed control signal in response to the reference signal being lower than the feedback signal.

15. The memory device of claim 14, wherein the low-voltage clocked comparator comprises:
a plurality of dynamic comparators clocked by respective time-shifted clock signals, wherein the respective clock signals have a same clock period and are time shifted one with respect to the other by a fraction of the same clock period, wherein the dynamic comparators in the plurality of dynamic comparators are configured to sequentially compare the feedback signal to the reference signal to assert and de-assert respective output signals in response to the reference signal being higher and lower, respectively, than the feedback signal; and a monostable circuit configured to receive the output signals from the plurality of dynamic comparators and to assert the first pulsed control signal in response to assertion of any of the output signals received from the plurality of dynamic comparators.

16. The memory device of claim 15, wherein the low-voltage clocked comparator comprises a ring oscillator configured to produce the time-shifted clock signals for the plurality of dynamic comparators.

17. The memory device of claim 14, wherein the voltage regulator circuit comprises a first level shifter circuit arranged between the low-voltage clocked comparator and the first pass element, the first level shifter circuit being configured to shift the first pulsed control signal from a low-voltage domain to a high-voltage domain and to propagate the shifted first pulsed control signal to the first pass element in response to the second control signal being asserted.

18. The memory device of claim 11, wherein the first feedback network comprises a first resistance arranged in series with a first current generator between the output node and a ground node, wherein the feedback signal is produced at a node intermediate the first resistance and the first current generator.

19. The memory device of claim 18, wherein the first current generator comprises a variable current generator configured to produce a variable current as a function of a value of a first digital control signal, whereby the feedback signal is shifted as a function of the first digital control signal.

20. The memory device of claim 11, wherein the second feedback network comprises:

a second resistance arranged in series with a second current generator between the input node and a ground node, wherein the threshold signal is produced at a node intermediate the second resistance and the second current generator, and a further comparator configured to compare the regulated output voltage to the threshold signal, to assert the second control signal in response to the threshold signal being higher than the regulated output voltage, and to de-assert the second control signal in response to the threshold signal being lower than the regulated output voltage.

* * * * *